(12) United States Patent
Zheng et al.

(10) Patent No.: US 6,881,682 B2
(45) Date of Patent: Apr. 19, 2005

(54) METHOD AND STRUCTURE FOR REDUCING LEAKAGE CURRENT IN CAPACITORS

(75) Inventors: Lingyi A. Zheng, Boise, ID (US); Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 272 days.

(21) Appl. No.: 10/340,604

(22) Filed: Jan. 13, 2003

(65) Prior Publication Data

US 2003/0104672 A1 Jun. 5, 2003

Related U.S. Application Data

(60) Continuation of application No. 09/907,680, filed on Jul. 19, 2001, now Pat. No. 6,613,628, which is a division of application No. 09/651,998, filed on Aug. 31, 2000.

(51) Int. Cl.[7] ............................................. H01L 21/461
(52) U.S. Cl. ........................ 438/770; 438/775; 438/287
(58) Field of Search ................................ 438/287, 240, 438/770–776

(56) References Cited

U.S. PATENT DOCUMENTS

| | | |
|---|---|---|
| 5,254,505 A | 10/1993 | Kamiyama |
| 5,624,865 A | 4/1997 | Schuegraf et al. |
| 6,096,592 A | 8/2000 | Cho |
| 6,114,258 A | 9/2000 | Miner et al. |
| 6,380,056 B1 * | 4/2002 | Shue et al. .................. 438/591 |

OTHER PUBLICATIONS

Okada et al., "Oxynitiride gate dielectrics prepared by rapid thermal processing using mixtures of nitrous oxide and oxygen," Applied Phys. Lett., 61 (26), Dec. 28, 1992., America Institute of Physics, pp. 3163–3165.

G. Lucovsky, "Ultrathin nitrided gate dielectrics: Plasma processing, chemical characterization, performance, and reliability", IBM Res. Develop., vol. 43, No. 3. May 1999, pp. 301–326.

Michael J. Hartig et al, "A Model for the Gas–Phase Chemistry Occuring in a Furnace $N_2O$ Oxynitride Process," J. Electrochem. Soc., vol. 143, No. 5, May 1996, pp. 1753–1762.

* cited by examiner

Primary Examiner—H. Jey Tsai
(74) Attorney, Agent, or Firm—Dickstein Shapiro Morin & Oshinsky LLP

(57) ABSTRACT

A method of forming a capacitor with reduced leakage current on a substrate in a semiconductor device is set forth. A first layer of a conductive material is formed over the substrate, and a second layer of a dielectric is formed over the first layer. The second layer is contacted with hydrogen, oxygen and nitrous oxide gases to form an oxidation layer over the second layer. A third layer of a conductive material is formed over the second layer to thereby form the capacitor. While the capacitor exhibits an improved leakage current reduction, overall capacitance is substantially unaffected, as compared to a similar capacitor having an oxidation layer built from a combination of oxygen and hydrogen gases only.

11 Claims, 5 Drawing Sheets

METHOD AND STRUCTURE FOR REDUCING LEAKAGE CURRENT IN CAPACITORS

This application is a continuation of U.S. patent application Ser. No. 09/907,680, filed Jul. 19, 2001, now U.S. Pat No. 6,613,628 which is a divisional of U.S patent application Ser. No. 09/651,998, filed Aug. 31, 2000, the entire disclosures of both being incorporated herein by reference.

FIELD OF THE INVENTION

The present invention relates to a method of forming a capacitor with reduced leakage current, and more particularly, to a method of oxidizing a capacitor dielectric layer so that leakage current across the conductive layers of the capacitor is reduced while capacitance is substantially unaffected. The invention also relates to the capacitor structures formed according to the various embodiments of the method herein set forth.

BACKGROUND OF THE INVENTION

FIG. 1 illustrates a semiconductor device 110 containing a planar capacitor structure 114 formed over a substrate 112. The structure of FIG. 1 is not intended to represent a particular capacitor as constructed in a semiconductor device, but is merely used as an example to illustrate the main components of such a capacitor. Substrate 112 may be formed, for example, of silicon or silicon-on-insulator (SOI) material or other well known substrate material. A first conductive layer or bottom electrode 116 is formed over the substrate using materials and methods known in the art. For example, the first conductive layer may be formed of two layers: a polysilicon bottom layer with a hemispherical silicon grain, or HSG, layer atop the polysilicon.

The capacitor structure 114 may be coupled to an active region 113 in the substrate, for example a source or drain region of a MOS transistor. Alternately, the capacitor structure 114 may be insulated from the substrate 112 through an insulating region. A capacitor dielectric layer 118 is formed over the conductive layer 116, and may be formed of a substantially nonconductive material such as, for example, silicon nitride ($Si_3N_4$), or other dielectric material known in the art. A thin protective layer 119 is then formed over the dielectric layer using gaseous oxygen and hydrogen. The protective layer may thus comprise silicon dioxide ($SiO_2$) which forms as the oxygen reacts with the silicon from the silicon nitride in the dielectric. The protective layer serves to "heal" any defects in the dielectric layer 118 which might cause leakage problems across the resulting capacitor. A second conductive layer or top electrode 122 is formed over the protective layer and may be formed with polysilicon or other conductive material.

In order to effectively utilize the capacitor 114 in modern dynamic random access memories (DRAMs), however, it has been necessary to reduce its size and substantially minimize the thickness of the dielectric layer 118. In many embodiments, it is therefore especially desirable that the dielectric layer be less than about 60 Angstroms in thickness, and even more desirably, less than about 50 Angstroms thick. Unfortunately, leakage current between the first and second conductive layers 116, 122 tends to increase exponentially as the thickness of the dielectric layer 118 is reduced to below 50 Angstroms. While formation of the protective layer 119 has been instrumental in helping to reduce this leakage current, there is still considerable need for a further reduction to enhance overall capacitor performance, as capacitor sizes continue to shrink in memory devices.

What is therefore needed in the art is a new method of forming a capacitor structure which results in reduced leakage current, while overall capacitance is substantially unaffected. Also needed are new capacitors in which leakage current between conductive layers is minimized, while capacitance is substantially maintained.

SUMMARY OF THE INVENTION

The invention provides a method of forming a capacitor in a semiconductor device in which a first layer of conductive material is first formed, a second layer of a dielectric is formed over the first layer, the second layer is then contacted with hydrogen, oxygen and nitrous oxide gases to form an oxidation layer over the second layer, and a third layer of conductive material is then formed over the second layer. The resulting structure exhibits a lowered current leakage with little loss of capacitance when compared with similar capacitor structures in which the dielectric is built with a conventional hydrogen and oxygen treatment which forms an oxidation layer on the dielectric.

The invention further provides a method of oxidizing a capacitor dielectric by contacting it with hydrogen, oxygen and nitrous oxide gases to form an oxidation layer thereon. Other suitable gases would include those with an O (oxygen) or F (fluorine) moiety that bonds strongly to silicon.

The invention also provides a method of oxidizing a capacitor dielectric which involves adding an oxygen containing gaseous material (e.g, nitrous oxide) to a mixture of oxygen and hydrogen gases, and then contacting the capacitor dielectric with the gaseous mixture so as to form an oxidation layer over the capacitor dielectric. The thus processed dielectric has a lower leakage current than does the same dielectric having an oxidation layer formed by contacting the dielectric with only hydrogen and oxygen gases under the same reaction conditions.

The invention also provides a method of forming a capacitor dielectric over a substrate in which a layer of silicon nitride is deposited over a conductive layer which has first been formed over a substrate. The silicon nitride layer is then contacted with hydrogen, oxygen and nitrous oxide gases so as to form an oxidation layer thereon.

The invention also provides a method of oxidizing a dielectric layer of capacitor in an intermediate stage of fabrication in which the dielectric layer is exposed to a combination of hydrogen, oxygen and nitrous oxide gases, and the flow rate of the nitrous oxide gas is increased during oxidation while the flow rate of the hydrogen and oxygen gases are maintained substantially constant. The gas ratio of nitrous oxide to hydrogen and oxygen can be varied by either changing the nitrous oxide gas flow rate while keep the hydrogen and oxygen flow rates constant, or vice versa.

The invention also provides a semiconductor device having a substrate with at least one capacitor formed thereover. The capacitor includes first and second conductive layers, with a dielectric between these two layers which has been oxidized in the presence if by hydrogen, oxygen, and nitrous oxide gases to produce an oxidation layer over the dielectric.

The invention further provides a memory cell of a semiconductor device which includes a container capacitor. The capacitor has first and second conductive layers, a dielectric layer between the conductive layers and an oxidation layer over the dielectric layer. The oxidation layer is formed by an oxidation of the dielectric layer in the presence of a combination of hydrogen, oxygen and nitrous oxide gases.

The invention further provides an integrated circuit which includes at least one capacitor formed over a substrate, wherein the capacitor contains a first conductive layer, a dielectric layer over the conductive layer, an oxidation layer over the dielectric layer, and a second conductive layer over the dielectric layer. The oxidation layer is formed by an oxidation of the dielectric layer in the presence of a combination of hydrogen, oxygen and nitrous oxide gases.

The invention also provides a processor based system which includes a processor, and an integrated circuit device coupled to the processor. At least one of the processor and the integrated circuit device contains a capacitor which includes first and second conductive layers, a dielectric layer between the conductive layers and an oxidation layer over the dielectric layer. The oxidation layer is formed by an oxidation of the dielectric layer in the presence of a combination of hydrogen, oxygen and nitrous oxide gases.

These and other advantages and features of the present invention will become more readily apparent from the following detailed description and drawings which illustrate various exemplary embodiments.

DETAILED DESCRIPTION OF THE PREFERRED EMBODIMENTS

The invention in its broadest embodiment is directed to a method of fabricating a capacitor for use in a semiconductor device in which leakage current across conductive layers is reduced, while overall capacitance is substantially maintained.

Reference herein shall be made to the term "substrate," which is to be understood as including silicon, a silicon-on-insulator (SOI) or silicon-on-sapphire (SOS) structures, doped and undoped semiconductors, epitaxial layers of silicon supported by a base semiconductor foundation, and other semiconductor structures. In addition, when reference is made to a "substrate" in the following description, previous process steps may have been utilized to form arrays, regions or junctions in or over the base semiconductor structure or foundation. In addition, the semiconductor need not be silicon-based, but could be based on silicon-germanium, germanium, indium phosphide, or gallium arsenide. The term "substrate" as used herein may also refer to any type of generic base or foundation structure.

Figure 1:
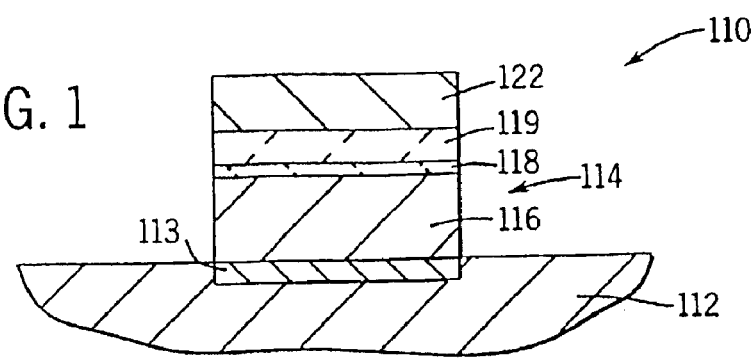
FIG. 1 is a cross sectional view of a conventional planar capacitor.
Figure 2A:
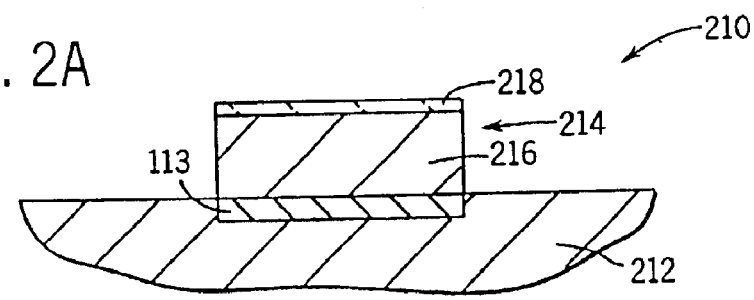
FIG. 2A is a cross sectional view of a semiconductor device showing a capacitor in an intermediate stage of fabrication according to one exemplary embodiment of the invention.

Referring again to the drawings in which like numerals indicate like components throughout the various embodiments, FIG. 2A shows a planar capacitor 214 formed over a substrate 212 in a semiconductor device 210 in an intermediate stage of fabrication. Also shown in FIG. 2A are a first conductive layer 216 and a dielectric layer 218. For purpose of simplication, it will be assumed that planar capacitor 214 connects with an active region 113 in substrate 212, though this is not necessary to the invention. The first conductive layer 216 is formed of one or more conductive materials, for example, a layer of polysilicon over a layer of HSG, both of which may be deposited over region 113 ($SiH_4$) gas via a chemical vapor deposition (CVD) or low pressure chemical vapor deposition (LPCVD) process at moderate temperature of about 500 to 600° C., or other known process in the art. The thickness of the first conductive layer is typically within the range of about a few Angstroms to several hundred Angstroms. Thereafter, the dielectric layer 218 is formed of a substantially non-conductive material such as, for example, silicon nitride ($Si_3N_4$). The silicon nitride dielectric layer 218 may be deposited using dichlorosilane ($SiH_2Cl_2$) and ammonia ($NH_3$) gases using LPCVD. It is preferred that the dielectric layer 218 be relatively thin as compared to the conductive layer 216. More desirably, the dielectric layer 218 should not exceed about 60 Angstroms in thickness. It is even more preferred that the dielectric layer not exceed about 50 Angstroms in thickness. In certain embodiments, a dielectric layer which is between about 40 to 50 Angstroms in thickness, more preferably between about 45 to 50 Angstroms, may be especially desirable. The dielectric layer serves as an insulator between the first conductive layer 21 and the second conductive layer 222, hereinafter defined. While it is desirable that the dielectric layer not be too thick, it is also preferred that this layer not be too thin, as it may not then be a strong enough insulator to stop charges from passing between the first and second conductive layers.

Figure 2B:
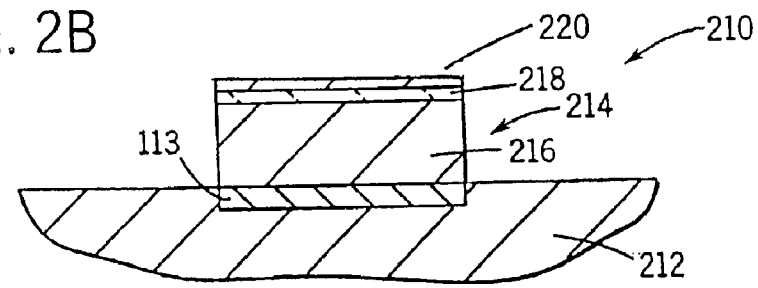
FIG. 2B is a cross sectional view of the device shown in FIG. 2A in a further stage of fabrication.

Referring now to FIG. 2B, an oxidation layer 220 is next formed over the dielectric layer 218. As used herein, the term "oxidation" is used to denote an initial oxidation of the dielectric layer, or may be used to denote an oxidation of the dielectric layer which occurs after previous oxidation of the dielectric layer has occurred. The oxidation layer will serve to repair or heal any defects in the dielectric layer 218. These defects may take the form of "pinholes" or other openings in the dielectric layer, which if left untended, could reduce the effectiveness of the dielectric layer by allowing charges to pass through. The oxidation layer is formed of an insulative material, e.g an oxide, which effectively plugs the pinholes in the dielectric layer 218.

To form the oxidation layer 220, the dielectric layer 218 is contacted with a combination of gases. These include hydrogen, oxygen and nitrous oxide ($N_2O$) gases. Reaction of the hydrogen, oxygen and nitrous oxide gases typically takes place in an atmospheric furnace at a temperature within the range of about 600 to 1000° C., with about 700 to 800° C. being preferred. The flow rates for each of the reaction gases are within the range of about 1 to 15 standard-liters/minute (slm), more desirably about 2 to 10 slm. Preferably, the gases are introduced together into the atmospheric furnace. The oxidation layer is grown over the dielectric layer so as to be relatively thin, and preferably is less than about 5 Angstroms, and more preferably less than about 3 Angstroms.

In a preferred embodiment of the invention, the flow rate for the nitrous oxide gas is at least about 0.5 slm, more preferably about 2.5 slm, and is even more preferably at least about 5 slm. For some dielectric layers, it may be desirable to have a flow rate for the nitrous oxide of at least about 10 slm. It has now been discovered that as the flow rate of nitrous oxide introduction is increased, leakage current is reduced, even as all other reaction parameters are kept substantially constant. Even more desirably, the flow rates of hydrogen and oxygen gas introduction are maintained constant at a rate within the range of about 4 to 8 slm, with about 5 to 7 slm being more preferred while the flow rate of the nitrous oxide gas is increased during the oxidation period. In some embodiments, the flow rate of the nitrous oxide will be within the range of about 0.05 to about 1.7 times that of the respective flow rates for hydrogen and oxygen.

Figure 2C:
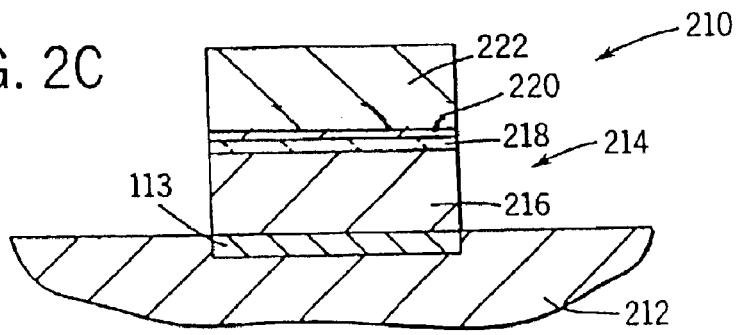
FIG. 2C is a cross sectional view of the device shown in FIG. 2B in a further stage of fabrication.

Referring now to FIG. 2C, after oxidation of the dielectric layer 218 to form oxidation layer 220 a second conductive layer 222 is formed over the oxidation layer 220. The second conductive layer forms the upper electrode or cell plate of the capacitor 214. The second conductive layer is deposited using a conductive material and may comprise, for example, doped polycrystalline silicon, or polysilicon for short. The second conductive layer of polysilicon may be formed using silane gas to deposit the polysilicon. Preferably, deposition takes place using a CVD or LPCVD process. The thickness of the second conductive layer can vary from about a few Angstroms to several hundred Angstroms as needed for a particular environment of use.

It is to be understood that the shape of the formed capacitor 214 shown in FIG. 2C is for purposes of illustration only. Those skilled in the art will recognize that any suitable shape is within the scope of the invention, and therefore the capacitor may be a planar, curved or container capacitor, or have other configuration, and may have a cross-sectional shape of a square, rectangle, oval, trapezoid, parallelogram, or other any other suitable shape, for example.

It is now been found that the capacitor 214 formed with the oxidation layer 220 using a combination of hydrogen, oxygen and nitrous oxide gases as heretofore set forth exhibits substantially reduced leakage current. For example, the leakage current as measured at −1.6 Volts for a thickness of dielectric layer (which is less than or equal to 59 Angstroms) is less than about −3.00 E$^{-08}$, and preferably is less than about −2.50 E$^{-08}$. It is especially preferred that the leakage current be less than about −2.00 E$^{-08}$.

The capacitor 214 of the invention exhibits substantially reduced leakage current as compared to a capacitor having an identical structure except that the oxidation layer is formed under the same reaction conditions using only hydrogen and oxygen gases. Thus, it is within the scope of the invention that leakage current of the resulting capacitor can be reduced by at least about 30% and more desirably by at least about 40% as compared to a capacitor formed with an oxidation layer formed using only hydrogen and oxygen gases. In a more preferred embodiment, reduction of leakage current can be at least about 50%.

The aforesaid reduction in leakage current occurs while capacitance of the formed capacitor 214 is substantially unaffected. As used herein, the term "substantially unaffected" means that any change in capacitance does not exceed about 10%. Once again, the standard for comparison is a capacitor having a dielectric layer which is formed using hydrogen and oxygen gases only (with no nitrous oxide) using the same process conditions and having the same structural configuration.

The capacitors formed according to the various embodiments of the invention should have a capacitance which is at least about 20.00 fF/um$^2$ as measured at −1.6 volts for a 47 Angstrom thick dielectric layer.

While not wishing to be bound by any particular theory, it appears that the oxidation layer 220 formed from the combination of hydrogen, oxygen and nitrous oxide gases more effectively seals the pinholes and cures other defects present in the dielectric layer 220 than does a layer formed using hydrogen and oxygen alone under the same reaction conditions. Atomic oxygen (O) might be more effective than molecular oxygen ($O_2$) in this regard, and may reduce the Si, N or other dangling bonds which generally cause defects in the dielectric layer 220. It is perhaps the combination of hydrogen, oxygen and nitrous oxide which generates/liberates more atomic oxygen than does the combination of hydrogen and oxygen gases alone.

Therefore, it is certainly within the scope of the invention to utilize other chemical compounds or materials which together with hydrogen and oxygen gases may effectively liberate more atomic oxygen than could otherwise be generated using hydrogen and oxygen alone. The invention therefore also comprises utilization of an atomic oxygen-generating material in conjunction with oxygen and hydrogen gases in the method as heretofore described.

Figure 3:
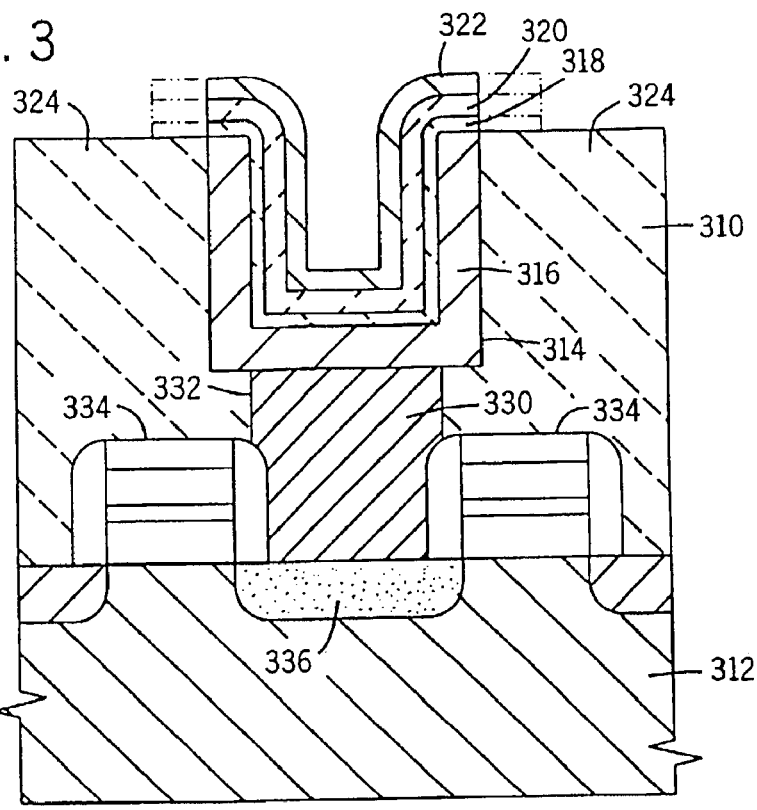
FIG. 3 is a cross sectional view of a capacitor structure according to a further exemplary embodiment of the invention.

Referring now to FIG. 3, there is illustrated a further embodiment of the invention. Shown is a more traditional container capacitor structure 314 formed as part of a memory cell of a memory device 310. The capacitor structure 314 is formed in an insulator layer 324 which in turn is formed of any suitable insulating material such as silicon dioxide, or more preferably Boro-Phospho-Silicate Glass (BPSG). A conductive plug 330 formed in a contact opening 332 between a pair of gate stacks 334 provides access for the capacitor 314 to a memory cell access transistor source/drain region 336 in the substrate 312. Capacitor 314 in FIG. 3 is shown with a first conductive layer 316 formed within an opening 332 in insulating layer 324 over the substrate 312, a thin dielectric layer 318 formed over the first conductive layer 316, an oxidation layer 320 formed as described above over the dielectric layer 318, and the second conductive layer 322 formed over the oxidation layer 320. If desired, one or more of the capacitor components may be initially formed to extend over the insulator material 324 outside of the contact opening 332, and may be subsequently planarized using etch back or chemical mechanical planarization (CMP) techniques to the level shown in FIG. 3.

The following examples illustrate the invention according to various embodiments, but should not be construed as limiting the scope thereof.

EXAMPLE

Planar capacitor structures (as illustrated in FIG. 2D) were formed comprising HSG (Hemispherical Silicon Grain) as the bottom electrode or first conductive layer 216, silicon nitride as the dielectric layer 218, and polysilicon as the top electrode or second conductive layer 222. In each group an oxidation layer 220 was also formed over the dielectric layer before the top electrode was fabricated. In the capacitors of Group 1 the oxidation layer was formed using hydrogen and oxygen gases only. For capacitors in Groups 2, 3, 4, the method of the invention was utilized incorporating nitrous oxide in the oxidation gas mixture. In each of these groups (1 through 4) some capacitors were formed with dielectric layers having a thickness of 47 Angstroms, while in others the dielectric layer thickness was 59 Angstroms. The results are shown in TABLE 1:

TABLE 1

| | Group 1 (Control) | | Group 2 | | Group 3 | | Group 4 | |
|---|---|---|---|---|---|---|---|---|
| Group label | Group 1-47A | Group 1 59A | Group 2 47A | Group 2 59A | Group 3 47A | Group 3 59A | Group 4 47A | Group 4 59A |
| Cell nitride Thickness | 47A | 59A | 47A | 59A | 47A | 59A | 47A | 59A |
| Post oxidation process | $H_2$ gas flow: 6 slm $O_2$ gas flow: 6 slm Temperature: 750 C. | | $H_2$ gas flow: 6 slm $O_2$ gas flow: 6 slm $N_2O$ gas flow: 2.5 slm Temperature: 750 C. | | $H_2$ gas flow: 6 slm $O_2$ gas flow: 6 slm $N_2O$ gas flow: 5 slm Temperature: 750 C. | | $H_2$ gas flow: 6 slm $O_2$ gas flow: 6 slm $N_2O$ gas flow: 10 slm Temperature: 750 C. | |
| Thickness of oxide on bare Si wafers after oxidation process* | 99A | | 98A | | 98A | | ~104A | |
| Wafer number | 1, 5, 9 | 13, 17, 21 | 2, 6, 10 | 14, 18, 22 | 3, 7, 11 | 15, 19, 23, 25 | 4, 8, 12 | 16, 20, 24 |

*A blank Si wafer is generally used to monitor the oxidation process. The oxide thickness grown on the blank Si wafer is used to control and target the oxidation process. Thus, the thickness of the oxide on the Si monitor wafer is matched to about 100 A here. Other monitor oxide thicknesses are certainly feasible, depending on the applications.

TABLE 2 shows a comparison of electrical data for the formed capacitors listed in TABLE 1:

TABLE 2

| | Group 1 | | Group 2 | | Group 3 | | Group 4 | |
|---|---|---|---|---|---|---|---|---|
| Group label | Group 1-47A | Group 1 59A | Group 2 47A | Group 2 59A | Group 3 47A | Group 3 59A | Group 4 47A | Group 4 59A |
| Capacitance ($fF/um^2$) | 21.08 | 17.82 | 20.95 | 17.44 | 20.69 | 16.39 | 20.61 | 17.35 |
| Leakage at −1.6 V ($A/cm^2$) | −4.46E-08 | −3.08E-09 | −2.05E-08 | −2.68E-09 | −1.88E-08 | −2.58E-09 | −1.64E-08 | −2.68E-09 |
| Capacitance refer to group 1 | 1 | 1 | 0.99 | 0.98 | 0.98 | 0.92 | 0.98 | 0.97 |
| Leakage refer to group 1 | 1 | 1 | 0.46 | 0.87 | 0.42 | 0.84 | 0.37 | 0.87 |

From TABLE 2, it can be seen that the capacitors in Groups 2 through 4 have significantly reduced leakage current as compared to the capacitors of Group 1 formed using the conventional oxidation process. In addition, the leakage current data which is obtained is better for the capacitors with a 47 Angstrom dielectric layer than for capacitors with a 59 Angstrom layer. Overall, leakage current for the capacitors of Group 1 is reduced by 54–63%, while capacitance is reduced by only 1–2%. The capacitors of Groups 2–4 also display leakage current which is not in excess of −3.08 E−08. In particular, the leakage current for the capacitors with a 47 Angstrom dielectric layer is not in excess of −2.05 E−08.

Figure 4:
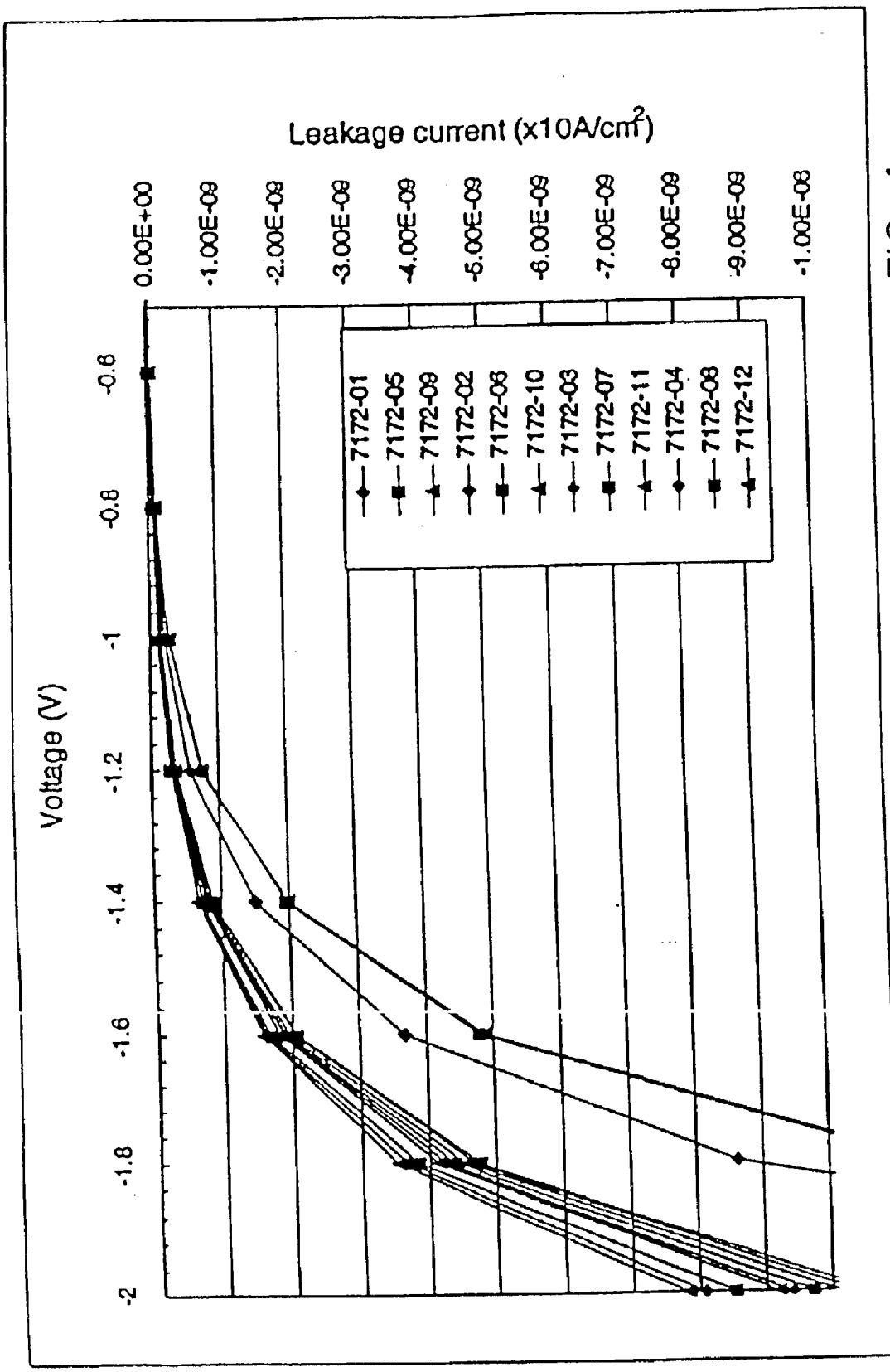
FIG. 4 is a leakage current vs. voltage plot (I–V plot) as measured for various capacitors with a cell dielectric at 47 Angstroms after various oxidation processes according to various exemplary embodiments of the invention.
Figure 5:
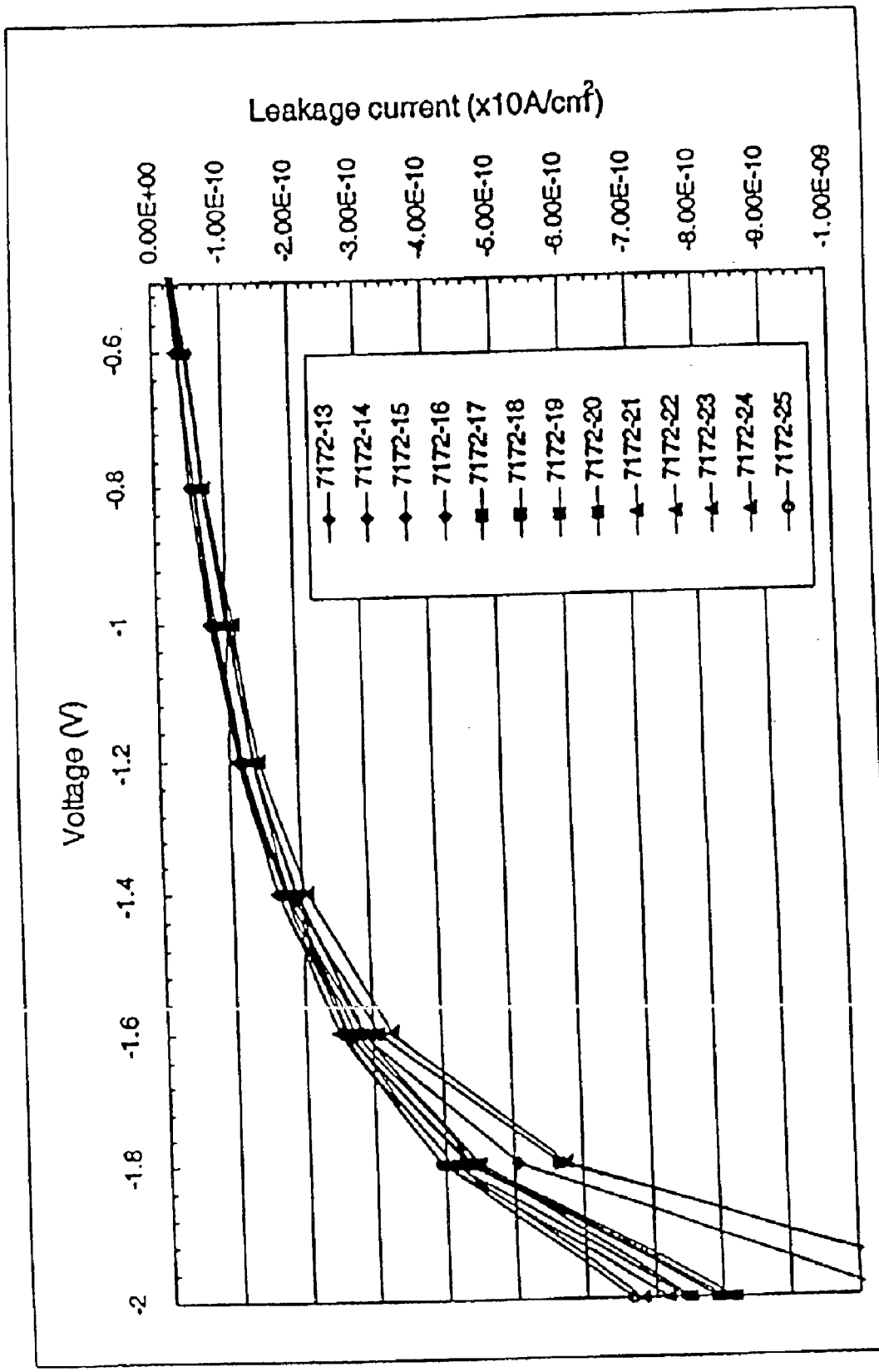
FIG. 5 is a leakage current vs. voltage plot (I–V plot) as measured for various capacitors with a cell dielectric at 59 Angstroms after various oxidation processes according to various exemplary embodiments of the invention.
Figure 6:
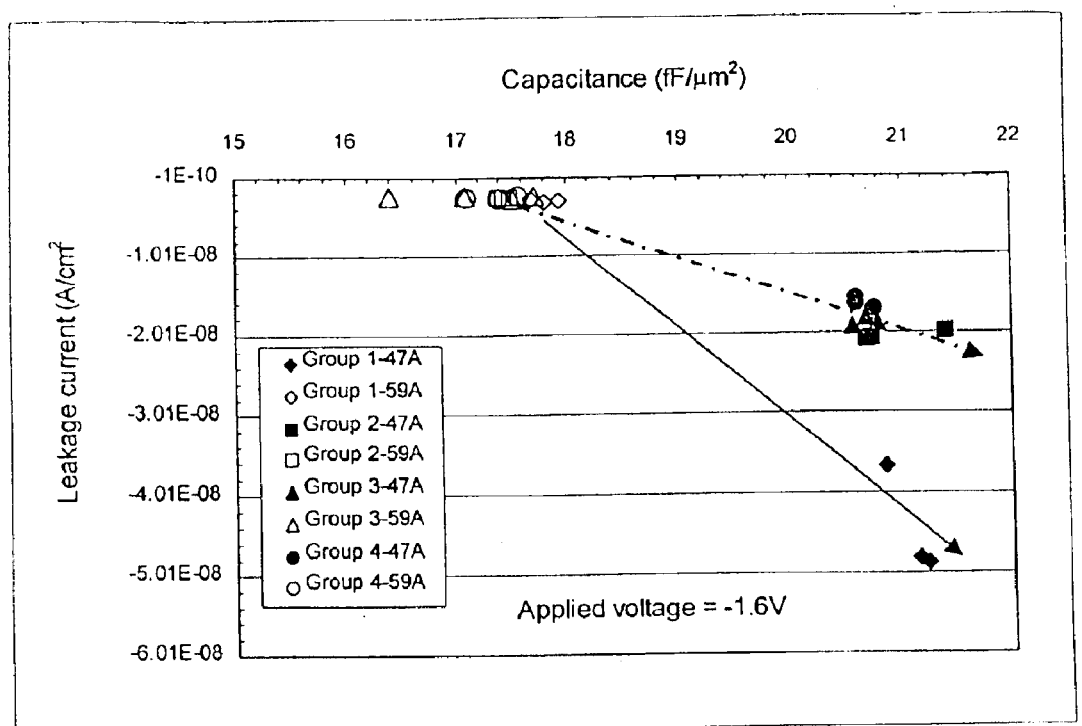
FIG. 6 is a leakage current vs. capacitance plot as measured for the capacitors of FIGS. 4 and 5, with 47 Angstrom and 59 Angstrom dielectric layers respectively, after oxidation processes according to various exemplary embodiments of the invention.

The performance results are shown plotted in FIGS. 4, 5 and 6 (the numbers in the insets represent the wafer numbers from TABLE 1). In FIG. 4, the capacitors of Group 1 (with a 47 Angstrom dielectric layer) show a significant amount of leakage current throughout a range of voltages (as indicated by the two lower plotted lines; the plots for wafers 5 and 9 have overlapped in FIG. 4) than do the capacitors of the invention from Groups 2, 3, and 4. Similar, although not as pronounced, results are shown in FIG. 5 where the three lower descending plots represent the wafers 13, 17 and 21 of Group 1. In FIG. 6, capacitance performance has been plotted against leakage current. It is observed that the capacitance of the wafers of Groups 2, 3 and 4 is substantially unaffected (across the x axis) while leakage current is substantially improved, i.e. is less negative in the y direction, as compared to the wafers of Group 1.

Figure 7:
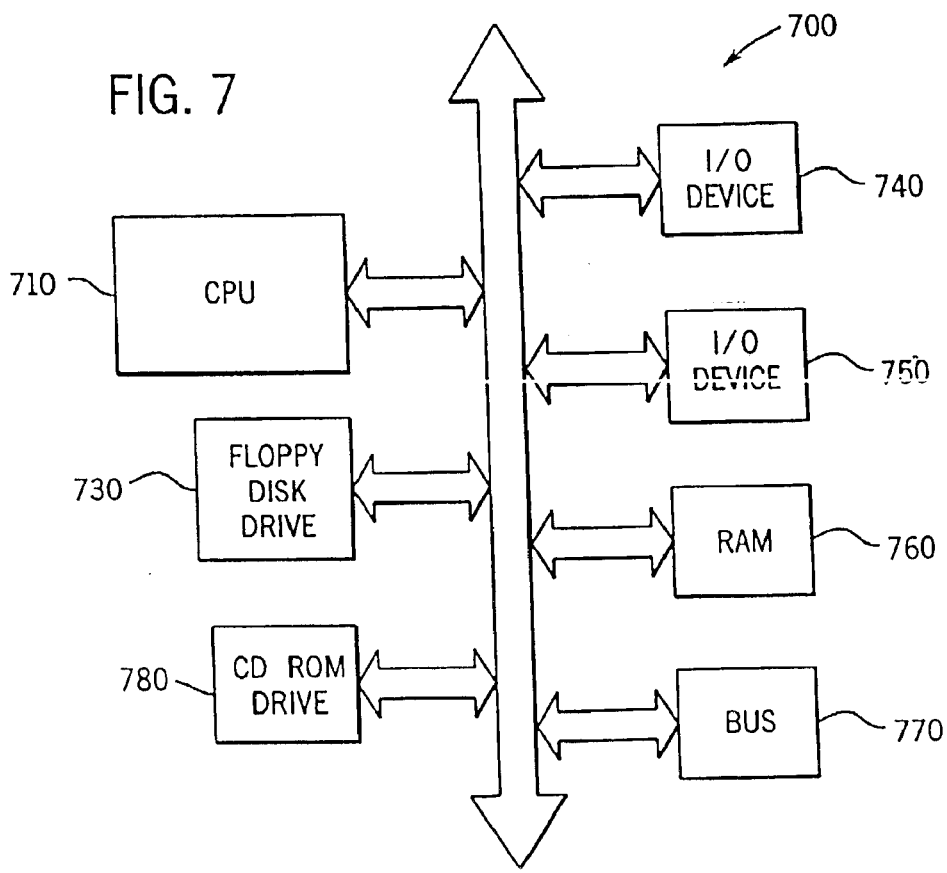
FIG. 7 is a block diagram of a typical processor based system which includes integrated circuits that utilize capacitors constructed in accordance with exemplary embodiments of the present invention.

Due at least in part to their improved electrical characteristics, the capacitors herein described have wide applicability in the semiconductor industry. A typical processor system which includes integrated circuits that utilize one or more of the capacitors formed in accordance with the present invention is illustrated generally at 700 in FIG. 7. A processor system, such as a computer system, for example, generally comprises a central processing unit (CPU) 710, for example, a microprocessor, that communicates with one or more input/output (I/O) devices 740, and a hard drive 750 over a bus system 770 which may include one or more busses and/or bus bridges. The computer system 700 also includes a hard disk drive 720, a floppy disk drive 730, a random access memory (RAM) 760, a read only memory (ROM) 780 and, in the case of a computer system may include other peripheral devices such as a compact disk (CD) ROM drive 730 which also communicate with CPU 710 over the bus 770. The invention may be used to produce capacitors in one or more of the processor, RAM and ROM, or a chip containing a processor and embedded memory. While FIG. 7 shows one exemplary computer system architecture, many others are also possible.

The foregoing description is illustrative of exemplary embodiments which achieve the objects, features and advantages of the present invention. It should be apparent that many changes, modifications, substitutions may be made to the described embodiments without departing from the spirit or scope of the invention. The invention is not to be considered as limited by the foregoing description or embodiments, but is only limited by the construed scope of the appended claims.

What is claimed as new and desired to be protected by Letters Patent of the United States is:

1. A method of exposing an oxidized layer on a dielectric material, comprising:

providing a dielectric material; and contacting said dielectric material with a combination of hydrogen, oxygen and nitrous oxide gases by exposing said dielectric material to a flow of nitrous oxide gas, a flow of oxygen gas and a flow of hydrogen gas, wherein the flow rate of nitrous oxide gas is increasing during the exposure while the flow rates of the oxygen and hydrgen gases are maintained to be constant during the exposure.

2. The method of claim 1, wherein said exposing is effected at a temperature within the range of about 500 to 1000 C., a flow rate for said hydrogen of about 4 to 8 slm, a flow rate for said oxygen of about 4 to 8 slm, and a flow rate for said nitrous oxide of at least about 0.5 slm.

3. The method of claim 2, wherein said exposing is effected at atmospheric pressure.

4. The method of claim 3, wherein said exposing is effected at a temperature within the range of about 700 to 800° C.

5. The method of claim 4, wherein said exposing is effected at a flow rate for said nitrous oxide of at least about 5 slm.

6. The method of claim 5, wherein said exposing is effected a flow rate for said nitrous oxide of at least about 10 slm.

7. The method of claim 3, wherein said oxidized layer is formed to a thickness less than that of said dielectric material.

8. The method of claim 7, wherein said oxidized layer is formed to a thickness less than about 5 Angstroms.

9. The method of claim 7, wherein said oxidized layer is formed to a thickness less than about 3 Angstroms.

10. The method of claim 9, wherein said flow rate for said nitrous oxide is about 0.05 to about 1.7 times the flow rate for each of said hydrogen and oxygen gases.

11. The method of claim 10, wherein said flow rate for said nitrous oxide is at least greater than the flow rate for each of said hydrogen and oxygen gases.

* * * * *